(12) United States Patent
Chen et al.

(10) Patent No.: US 7,919,982 B1
(45) Date of Patent: Apr. 5, 2011

(54) DIGITAL INTERFACE SENSING APPARATUS

(75) Inventors: Yang-Yuan Chen, Taipei Hsien (TW); Ming-Chih Hsieh, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/824,820

(22) Filed: Jun. 28, 2010

(30) Foreign Application Priority Data

Jun. 9, 2010 (TW) ................................. 99118647 A

(51) Int. Cl.
*H03K 17/16* (2006.01)
*H03K 19/0175* (2006.01)
(52) U.S. Cl. .......................................... 326/62; 326/30
(58) Field of Classification Search ....................... 326/30
See application file for complete search history.

(56) References Cited

U.S. PATENT DOCUMENTS

| | | | | |
|---|---|---|---|---|
| 5,892,933 A * | 4/1999 | Voltz | ............................. | 710/316 |
| 6,728,811 B2 * | 4/2004 | Yamada et al. | ............... | 710/300 |
| 7,308,514 B1 * | 12/2007 | Hewitt et al. | ................... | 710/66 |
| 7,391,788 B2 * | 6/2008 | Zhang et al. | ................... | 370/438 |
| 7,626,439 B2 * | 12/2009 | Miao et al. | ..................... | 327/309 |
| 7,814,249 B2 * | 10/2010 | Seo | ................ | 710/110 |
| 2004/0095952 A1 * | 5/2004 | Zhang et al. | ................. | 370/438 |
| 2006/0265107 A1 * | 11/2006 | Cho et al. | ....................... | 700/292 |
| 2007/0216548 A1 * | 9/2007 | Alfano et al. | ................... | 341/50 |
| 2007/0285042 A1 * | 12/2007 | Frankel et al. | ................ | 318/599 |
| 2008/0183919 A1 * | 7/2008 | Bourne et al. | ................. | 710/52 |
| 2010/0022234 A1 * | 1/2010 | Stepanian | ..................... | 455/420 |

* cited by examiner

*Primary Examiner* — Rexford N Barnie
*Assistant Examiner* — Thienvu V Tran
(74) *Attorney, Agent, or Firm* — Frank R. Niranjan

(57) ABSTRACT

A digital interface sensing apparatus includes a sensor, an analog detecting circuit, an analog to digital (A/D) converter, a signal cable, and an interface switch circuit. The sensor senses an external analog signal. The analog detecting circuit detects the sensed analog signal from the sensor. The A/D converter converts the sensed analog signal to a digital signal and receives a clock signal and a data demand signal. The A/D converter sends the digital signal in response to the A/D converter receiving the clock signal and the data demand signal. The interface switch circuit includes a multiplexer and a recommended standard 422 (RS-422) transceiver. The RS-422 transceiver is connected between the A/D converter and the multiplexer to switch RS-422 digital signal and transistor-transistor logic (TTL) signal. The multiplexer is connected between the A/D converter and the signal cable to selectively transfer RS-233 and RS-422 signals.

5 Claims, 1 Drawing Sheet

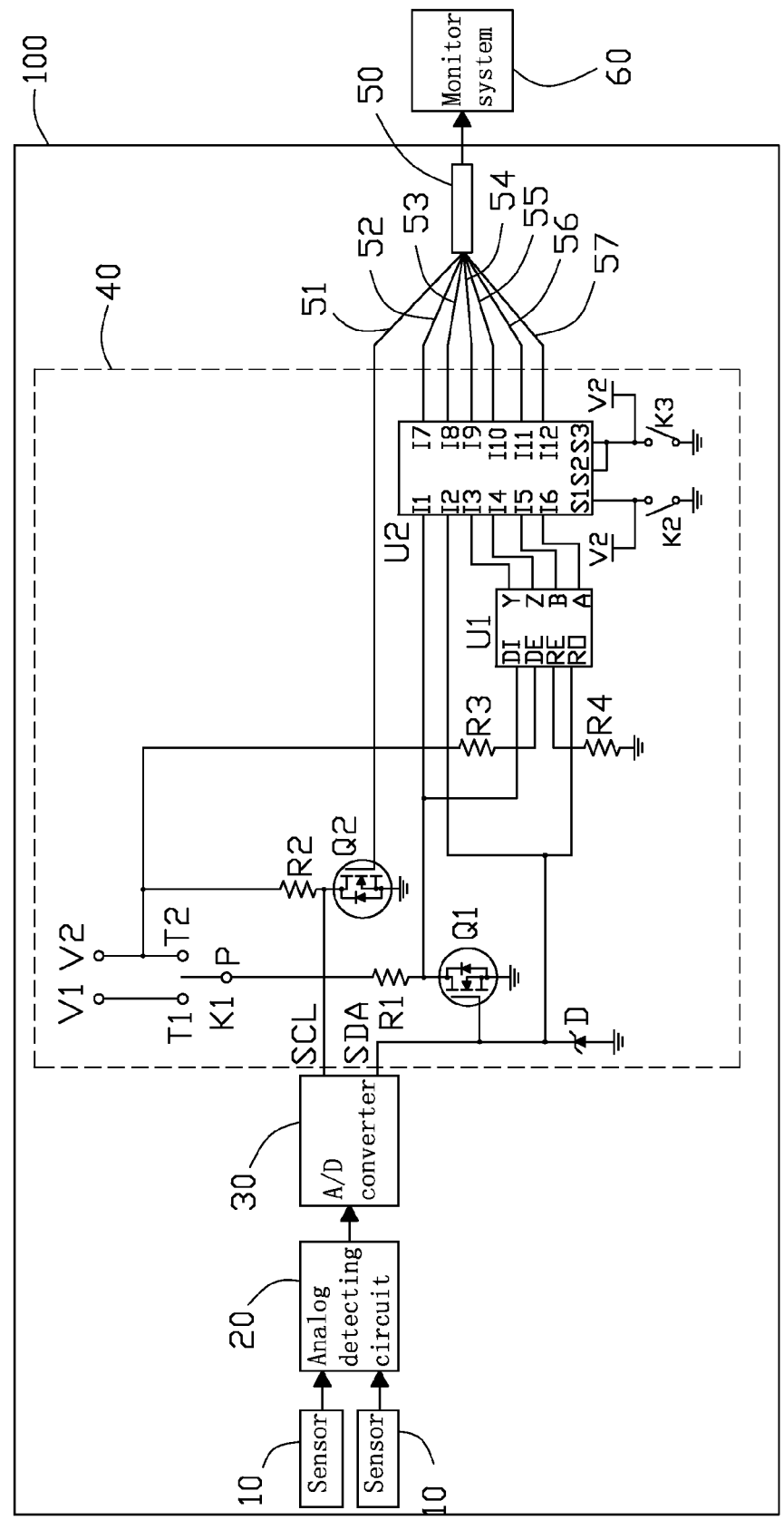

DIGITAL INTERFACE SENSING APPARATUS

BACKGROUND

1. Technical Field

The present disclosure relates to a digital interface sensing apparatus.

2. Description of Related Art

Sensors are used in a variety of monitoring applications such as to sense temperature and humidity. A monitor system will receive the sensory data as analog signals from the sensor via a signal cable. However, the analog signals may be negatively influenced by qualities of the cable. Therefore there is room for improvement in the art.

BRIEF DESCRIPTION OF THE DRAWING

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

The figure is a circuit diagram of a digital interface sensing apparatus, together with a monitor system.

DETAILED DESCRIPTION

The disclosure, including the accompanying drawing in which like references indicate similar elements, is illustrated by way of example and not by way of limitation. It should be noted that references to "an" or "one" embodiment in this disclosure are not necessarily to the same embodiment, and such references mean at least one.

Referring to the drawing, an embodiment of a digital interface sensing apparatus 100 includes two sensors 10, an analog detecting circuit 20, an analog to digital (A/D) converter 30, an interface switch circuit 40, and a signal cable 50. The sensors 10 are used in sensing applications, such as to sense ambient temperature and humidity in a room and send this sensory data as analog signals to the analog detecting circuit 20. The analog detecting circuit 20 is used to receive analog signals from the sensors 10 and send them to the A/D converter 30. The A/D converter 30 is used to convert the analog signals to digital signals and send the digital signals to the interface switch circuit 40. The signal cable 50 includes first to seventh lines 51-57. The analog detecting circuit 20 and the A/D converter 30 fall within well-known technologies, and are therefore not described here. In other embodiments, the number and type of the sensors 10 can be changed according to requirements.

The interface switch circuit 40 is used to receive the digital signals from the A/D converter 30, and send the digital signals to a monitor system 60 via a recommended standard 232 (RS-232) interface, an RS-422 interface, or equivalent. The interface switch circuit 40 includes a first voltage source V1, such as 12 volts (V), a second voltage source V2, such as 3.3V, a single-pole double-throw (SPDT) switch K1, a Zener diode D, two electronic switches which are two field effect transistors (FETs) Q1 and Q2, four resistors R1-R4, an RS-422 transceiver U1, a multiplexer U2, two switches K2 and K3. In other embodiments, the SPDT switch K1 also can be changed to other types of control switches.

The SPDT switch K1 includes a first throw T1 connected to the first voltage source V1, a second throw T2 connected the second voltage source V2, and a pole P connected to a drain of the FET Q1. The source of the FET Q1 is grounded. The gate of the FET Q1 is connected to a data pin SDA of the A/D converter 30. The data pin SDA of the A/D converter 30 is connected to the cathode of the Zener diode D. The anode of the Zener diode D is grounded. A clock pin SCL of the A/D converter 30 is connected to the drain of the FET Q2. The second voltage source V2 is connected to the drain of the FET Q2 via the resistor R2. The source of the FET Q2 is grounded. The gate of the FET Q2 is connected to the first line 51 of the signal cable 50.

A first input terminal DI of the RS-422 transceiver U1 is connected to the drain of the FET Q1. A first voltage terminal DE of the RS-422 transceiver U1 is connected to the second voltage source V2 via the resistor R3. A second voltage terminal RE of the RS-422 transceiver U1 is grounded via the resistor R4. A first output terminal RO of the RS-422 transceiver U1 is connected to the gate of the FET Q1. A first data terminal I1 of the multiplexer U2 is connected to the drain of the FET Q1. A second data terminal I2 of the multiplexer U2 is connected to the gate of the FET Q1. A third data terminal I3 and a fourth data terminal I4 of the multiplexer U2 are respectively connected to a second output terminal Y and a third output terminal Z of the RS-422 transceiver U1. A fifth data terminal I5 and a sixth data terminal I6 of the multiplexer U2 are respectively connected to a second input terminal B and a third input terminal A of the RS-422 transceiver U1. Seventh to twelfth data terminals I7-I12 of the multiplexer U2 are respectively connected to the second to sixth lines 52-57 of the signal cable 50. A first select terminal S1 of the multiplexer U2 is connected to the second voltage source V2 and grounded via the switch K2. A second select terminal S2 and a third select terminal S3 of the multiplexer U2 are respectively connected to the second voltage source V2 and grounded via the switch K3.

When the signal cable 50 is connected to the monitor system 60 with the RS-232 interface, the switch K2 is turned on and the switch K3 is turned off. The first data terminal I1 is connected to the seventh data terminal I7 of the multiplexer U2, the second data terminal I2 is connected to the eighth data terminal I8 of the multiplexer U2, and the forth to sixth data terminals I4 to I6 respectively disconnect from the eighth to twelfth data terminals I8 to I12. The first line 51 of the signal cable 50 is a clock signal data line, the second and third lines 52 and 53 are respectively a receiving data signal line and a transmitting data signal line. The pole P of the SPDT switch K1 is connected to the first throw T1. The first voltage source V1 satisfies the voltage standard of the RS-232 interface. The second voltage source V2 and the stable voltage of the Zener diode D both satisfy the voltage standard of inter-integrated circuit (I2C) interface.

To receive sensory data, the monitor system 60 sends a 12V first clock signal via the first line 51 to the FET Q2. The FET Q2 is turned on and off by the first clock signal, therefore, the clock pin SCL of the A/D converter 30 receives a corresponding second clock signal at the drain of the FET Q2. When the FET Q2 is turned off, the clock pin SCL of the A/D converter 30 is at voltage V2. When the FET Q2 is turned on, the clock pin SCL of the A/D converter 30 goes to ground. So the clock pin SCL of the A/D converter 30 has no effect on the monitor system 60. The second clock signal has a same frequency as the first clock signal and is 3.3V, which matches the voltage standard of the A/D converter 30. The monitor system 60 sends a data demand signal via the third line 53 of the signal cable 50, and the eighth and second data terminals I8 and I2 of the multiplexer U2. The data pin SDA of the A/D converter 30 receives the data demand signal from the monitor system 60.

The data pin SDA of the A/D converter 30 sends first digital signals, corresponding to the analog signals generated by the sensors 10, to the gate of the FET Q1. The FET Q1 is turned on and off by the 3.3V first digital signals, therefore the second line 52 of the signal cable 50 receives corresponding second digital signals at the drain of the FET Q1 via the first data terminal I1 and the seventh terminal I7 of the multiplexer U2. The second digital signals have a same frequency as the first digital signals and are a 12V voltage which matches the voltage standard of the monitor system 60. Therefore, the A/D converter 30 can communicate with the monitor system 60 by RS-232 interface type.

When the signal cable 50 is connected to the monitor system 60 with the RS-422 interface, the switch K3 is turned on and the switch K2 is turned off. The third to sixth data terminals 13 respectively connect to the ninth to twelfth data terminals I9 of the multiplexer U2, and the first to second data terminals I1 to I2 respectively disconnect from the seventh to eighth data terminal I7 to I8 of the multiplexer U2. The first line 51 of the signal cable 50 is a clock signal data line, the fourth and fifth lines 54 and 55 are respectively a positive and a negative receiving data signal lines, and the sixth and seventh lines 56 and 57 are respectively a positive and a negative transmitting data signal lines. The pole P is connected to the second throw T2 of the SPDT switch K1. The second voltage source V2 also satisfies the voltage standard of the RS-422 interface.

To receive sensory data, the monitor system 60 sends a 12V third clock signal via the first line 51. The FET Q2 is turned on and off by the third clock signal, therefore the clock pin SCL of the A/D converter 30 receives a corresponding fourth clock signal at the drain of the FET Q2. The fourth clock signal has a same frequency with the second clock signal and has a 3.3V voltage which matches the voltage standard of the A/D converter 30. The monitor system 60 sends a data demand signal in form of a differential pair to the second to third input terminals B, A of the RS-422 transceiver U1 via the sixth to seventh lines 56 and 57 of the signal cable 50, the eleventh to twelfth data terminal I11 to I2, the fifth to sixth data terminals I5 to I6. The RS-422 transceiver U1 converts the data demand signal to a transistor-transistor logic (TTL) signal and sends the TTL signal to the data pin SDA of the A/D converter 30 via the first output terminal RO thereof. Then, the A/D converter 30 sends third digital signals, corresponding to the analog signals generated by the sensors 10, to the gate of the FET Q1. The FET Q1 is turned on and off by the 3.3V third digital signals, therefore the first input terminal DI of the RS-422 transceiver U1 receives corresponding fourth digital signals at the drain of the FET Q1. The fourth digital signals have a same frequency with the third digital signals and have a 12V voltage which matches the voltage standard of the monitor system 60. The RS-422 transceiver U1 converts the fourth digital signals to a pair of differential signals. The pair of differential signals is sent to the monitor system 60, via the second output terminal Y and third output terminal Z of the RS-422 transceiver U1, the third, fourth, ninth, tenth data terminals I3 and I4, I9 and I10 of the multiplexer U2, the fourth line 54 and the fifth line 55 of the signal cable 50. Therefore, the A/D converter 30 can communicate with the monitor system 60 by RS-422 interface type.

Because the monitor system 60 receives the digital signals via the signal cable 50, which can improve signal transmitting quality. Furthermore, the digital interface sensing apparatus 100 can selectively communicate with the monitor system 60 by RS-232 and RS-422 interface types, which is convenient to use.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A digital interface sensing apparatus comprising:
a sensor to sense an external analog signal;
an analog detecting circuit to detect the sensed analog signal from the sensor;
an analog to digital (A/D) converter to convert the sensed analog signal to a digital signal, and receive a clock signal and a data demand signal, wherein the A/D converter sends the digital signal data in response to the A/D converter receiving the clock signal and the data demand signal;
a signal cable; and
an interface switch circuit comprising a multiplexer and a recommended standard 422 (RS-422) transceiver, the RS-422 transceiver connected between the A/D converter and the multiplexer to switch RS-422 digital signal and transistor-transistor logic (TTL) signal, the multiplexer connected between the A/D converter and the signal cable to selectively transfer RS-233 and RS-422 signals between the A/D converter and the signal cable.

2. The digital interface sensing apparatus of claim 1, wherein the interface switch circuit further comprises first and second voltage sources, a control switch, first and second electronic switches, first and second switch, the first and second voltage sources are connected to a first terminal of the first electronic switch via the control switch, the control switch selectively connect the first and second voltage sources and the first terminal of the first electronic switch, a second terminal of the first electronic switch is grounded, a control terminal of the first electronic switch is connected to a data pin of the A/D converter, a clock pin of the A/D converter is connected to a first terminal of the second electronic switch, the second voltage source is connected to the first terminal of the second electronic switch, a second terminal of the second electronic switch is grounded, a control terminal of the second electronic switch is connected to a first line of the signal cable, a first input terminal of the RS-422 transceiver is connected to the first terminal of the first electronic switch, a first output terminal of the RS-422 transceiver is connected to the control terminal of the first electronic switch, a first data terminal of the multiplexer is connected to the first terminal of the first electronic switch, a second data terminal of the multiplexer is connected to the control terminal of the first electronic switch, third and fourth data terminals of the multiplexer are respectively connected to second and third output terminals of the RS-422 transceiver, seventh to twelfth data terminals of the multiplexer are respectively connected to second to sixth lines of the signal cable, a first select terminal of the multiplexer is connected to the second voltage source and grounded via the first switch, second and third select terminals of the multiplexer are connected to the second voltage source and grounded via the second switch.

3. The digital interface sensing apparatus of claim 2, wherein the interface switch circuit further comprises a Zener diode, the data pin of the A/D converter is connected to the cathode of the Zener diode, the anode of the Zener diode is grounded.

4. The digital interface sensing apparatus of claim 2, wherein the control switch is a single-pole double-throw (SPDT) switch.

5. The digital interface sensing apparatus of claim 2, wherein the first and second electronic switches are field effect transistors (FETs).

* * * * *